United States Patent
Meng et al.

(10) Patent No.: US 10,187,999 B2
(45) Date of Patent: Jan. 22, 2019

(54) METHOD FOR MANUFACTURING AN ULTRA-THIN METAL LAYER PRINTED CIRCUIT BOARD

(71) Applicants: SUZHOU WEIPENG ELECTRICAL TECHNOLOGY CO.,LTD., Suzhou (CN); CHANGSHU MUTUAL-TEK CO.,LTD., Suzhou (CN)

(72) Inventors: Yuedong Meng, Suzhou (CN); Futang Fang, Suzhou (CN); Peng Chang, Suzhou (CN)

(73) Assignees: SUZHOU WEIPENG ELECTRICAL TECHNOLOGY CO., LTD., Suzhou (CN); CHANGSHU MUTUAL-TEK CO., LTD., Suzhou (CN)

( * ) Notice: Subject to any disclaimer, the term of this patent is extended or adjusted under 35 U.S.C. 154(b) by 0 days.

(21) Appl. No.: 15/557,806

(22) PCT Filed: Jul. 29, 2016

(86) PCT No.: PCT/CN2016/092378
§ 371 (c)(1),
(2) Date: Sep. 12, 2017

(87) PCT Pub. No.: WO2017/193487
PCT Pub. Date: Nov. 16, 2017

(65) Prior Publication Data
US 2018/0124923 A1    May 3, 2018

(30) Foreign Application Priority Data

May 13, 2016 (CN) .................. 2016 1 03168751

(51) Int. Cl.
*H05K 3/18* (2006.01)
*H05K 3/16* (2006.01)
(Continued)

(52) U.S. Cl.
CPC ........ *H05K 3/181* (2013.01); *H01J 37/32009* (2013.01); *H05K 3/16* (2013.01);
(Continued)

(58) Field of Classification Search
None
See application file for complete search history.

(56) References Cited

U.S. PATENT DOCUMENTS

2008/0286585 A1* 11/2008 Lem .................. C08L 79/08
428/458
2015/0329971 A1* 11/2015 Lee .................. H05K 3/381
427/535

(Continued)

FOREIGN PATENT DOCUMENTS

CN    101340774 A    1/2009
CN    101684554 A    3/2010
(Continued)

OTHER PUBLICATIONS

Arthur L. Ruoff et al: "Improvement of adhesion of copper on polyimide by reactive ion-bean etching", IBM Journal of Research and Development, 1988, vol. 32 No. 5.
(Continued)

*Primary Examiner* — Allan Olsen
(74) *Attorney, Agent, or Firm* — Gokalp Bayramoglu

(57) ABSTRACT

The present invention discloses a method for manufacturing a printed circuit board having an ultra-thin metal layer. The method discharges alkaline aliphatic amine gas and the nitrogen bubbled in the cupric sulfate solution via capacitive coupling in a vacuum, to generate low temperature plasma. The polyimide film and the epoxy resin board coated with fiberglass cloth are etched and the surface is treated to graft active groups, so as to increase the surface roughness and chemical activity. Subsequently, sputtering copper plating or
(Continued)

chemical copper plating is directly conducted. The electroplating is conducted to thicken the copper film to a required thickness. The method of the invention not only does not need adhesive (adhesive free), but also has a high peeling strength. It can be used for the preparation of the flexible PCB, the rigid PCB, the multi-layer PCB, and rigid-flex PCB, having an ultra-thin metal layer.

11 Claims, 6 Drawing Sheets

(51) Int. Cl.
  *H01J 37/32* (2006.01)
  *H05K 3/38* (2006.01)
(52) U.S. Cl.
  CPC ............... *H05K 3/18* (2013.01); *H05K 3/188* (2013.01); *H05K 3/38* (2013.01); *H01J 2237/334* (2013.01); *H05K 2203/072* (2013.01); *H05K 2203/0723* (2013.01); *H05K 2203/095* (2013.01)

(56) References Cited

U.S. PATENT DOCUMENTS

2018/0070454 A1* 3/2018 Meng ..................... H05K 3/02
2018/0124923 A1* 5/2018 Meng ..................... H05K 3/188

FOREIGN PATENT DOCUMENTS

| CN | 101746103 A | 6/2010 |
| CN | 102196904 A | 9/2011 |
| JP | 2008-260272 A | 10/2008 |

OTHER PUBLICATIONS

Ju Hi Hong et al: "Improvement of adhesion properties for Cu films on the polyimide by plasma source ion implantation",Surface & Coatings Technology. 2006, 201:197.

\* cited by examiner

METHOD FOR MANUFACTURING AN ULTRA-THIN METAL LAYER PRINTED CIRCUIT BOARD

CROSS REFERENCE TO RELATED APPLICATIONS

This application is the national phase entry of International Application No. PCT/CN2016/092378, filed on Jul. 29, 2016, which is based upon and claims priority to Chinese Patent Application No. 2016103168751 (CN), filed on May 13, 2016, the entire contents of which are incorporated herein by reference.

TECHNICAL FILED

The present invention relates to the field of microelectronic laminate design and manufacturing, particularly relates to a process of preparing a flexible board laminate and rigid board laminate having an ultra-thin metal layer, and a process of preparing a blind via, a buried via hole, a filling hole of a single-sided printed circuit board, a double-sided printed circuit board, a multilayer printed circuit board, a flexible printed circuit board, a rigid-flex printed circuit board, and a multilayer high-density interconnection printed circuit board.

BACKGROUND

The printed circuit board (PCB) is an electrical connection carrier of the electronic components. The PCB can be categorized as a rigid printed circuit board (RPC), a flexible printed circuit board (FPC), or a rigid-flex printed circuit board (RFPC). The PCB can be structurally categorized as a single-sided printed circuit board, a double-sided printed circuit board, or a multilayer printed circuit board (more than 3 layers). The rigid printed circuit board has characteristics of heat resistance, no deformation and better planeness. The flexible printed circuit board has an advantage of a high flexibility. The rigid-flex printed circuit board has functions and characteristics of both the rigid printed circuit board and the flexible printed circuit board, and it is widely used in the communication control module (CCM), and the camera module of devices such as a notebook computer, a tablet computer, a smart mobile phone, a wearable electronic bracelet, etc. The single-sided printed circuit board is widely used in the hard disc drives (HDD), optical pickup heads, etc., due to the characteristics of high flexibility and low cost. The circuit design of the double-sided printed circuit board is more complicated than that of the single-sided printed circuit board, and the thickness of the double-sided printed circuit board is also slightly more. A multilayer printed circuit board having more than three layers is more flexible in circuit design due to more layers.

Now a days, electronic products, such as a liquid crystal display (LCD), a plasma display panel (PDP), a chip on flex (COF), etc., require thin PCB laminates that can provide high density, high dimensional stability, high temperature resistance and reliability of the circuits. As the electronic products are becoming thinner and smaller, the thinner metal layer and dielectric layer are required in the print circuit board. The ultra-thin adhesive free circuit board will become a mainstream of the market, which gradually replaces the three layers (dielectric layer/adhesive layer/copper foil) adhesive laminate. Ultra-thin (smaller than 5 microns) circuit board needs a thinner copper foil. However, the thinnest copper foil existing in the current industry has a thickness of about 12 microns, and thus, it is hard to manufacture the ultra-thin circuit board. Also, if the copper foil is too thin, then it has low mechanical strength, so it is difficult to conduct the copper coating. A method to prepare an ultra-thin adhesive free circuit board is to conduct chemical copper plating or sputtering copper plating directly on the dielectric layer. However, due to smooth surface and poor hydrophilicity (a low surface energy) of the dielectric layer (polyimide, epoxy resin and etc.), the deposited copper film gets easily peeled off from the dielectric layer. It is necessary to conduct a modification treatment on the surface of the dielectric layer, so as to provide a good binding force between the dielectric layer and the deposited copper film. The peeling strength is required to be more than 7N/cm (industry standard).

In the recent ten years, researches on surface modification treatment of the dielectric material, polyimide film (PI), of the ultra-thin printed circuit board are actively carried out internationally. The main treatment methods include acid and alkali treatment method, plasma treatment method, ion beam treatment method, and surface grafting method.

In 1988, Ruoff et al. used the reactive oxygen ion beam to etch PI film, and to improve and measure adhesion between the PI film and copper by adjusting different energies, ion current density, etching time and other factors (Improvement of adhesion of copper on polyimide by reactive ion-bean etching [J]. IBM Journal of Research and Development, 1988, 32:5). The adhesive strength of the treated PI film, under optimal condition, was 6.9N/cm. Compared to the untreated PI film, though the adhesive strength of the treated PI film is increased nearly 25 times, it still fails to meet the standard of use. In 2006, Ju Hi Hong et al. used PSII (Plasma source ion implantation) technology to deposit copper film on the surface of the PI film. The results showed that the binding force between the copper film and the polyimide film was greatly increased, but it still cannot meet the requirement of use (Improvement of adhesion properties for Cu films on the polyimide by plasma source ion implantation [J]. Surface & Coatings Technology. 2006, 201:197). The patent application CN101684554A disclosed a chemical copper plating solution for a polyimide film and a method of surface chemical copper plating thereof, but it also failed to address the key problem of the binding force between the polyimide film and the copper film, and thus failed to break through the technical bottleneck of preparing the ultra-thin adhesive free printed circuit board laminate. The patent application CN102196904A disclosed a laminate and a manufacturing method thereof. The invention partially modified the surface of the resin film having a thermoplastic cyclic olefin resin by ionizing radiation.

SUMMARY OF THE INVENTION

According to types and mechanisms of the binding force, based on the properties of smooth surface and low surface energy of the dielectric layer, the present invention provides a method of manufacturing a printed circuit board having an ultra-thin metal layer, using a plasma technology.

The key factors that influence the binding strength between the dielectric layer and the metal layer of the printed circuit board are roughness and chemical activity of the surface of the dielectric layer. Based on these factors, the present invention provides a method for manufacturing a printed circuit board having an ultra-thin metal layer.

In the manufacturing method of the present invention, firstly, a modification treatment is conducted on the surface of the dielectric layer using plasma, and then chemical plating (also called electroless copper plating) or vacuum sputtering plating is conducted to coat a dense copper film having a thickness less than 100 nm. Finally, the copper film is electroplated to be thickened to the required copper film thickness. It can be used to manufacture a printed circuit board laminate having an ultra-thin metal layer and a high binding strength.

The method provided by the present invention specifically includes:

(1) providing a material to be etched in a chamber of a vacuum capacitive coupling discharge plasma generator; conducting a modification treatment on a surface of the material to be etched by a first plasma and a second plasma to obtain an etched material; wherein the first plasma is generated by discharging gaseous aliphatic amine via capacitive coupling in a vacuum, and the second plasma is generated by discharging nitrogen bubbled in a cupric sulfate solution via capacitive coupling in the vacuum; the modification treatment includes etching, and grafting active groups including amino, hydroxyl, and/or sulfonic acid radical on the surface of the material to be treated;

(2) fully or selectively forming a copper film on the surface of the etched material by an electroless copper deposition or a sputtering copper deposition. Preferably, the method further comprises steps as below:

(3) thickening the copper film obtained from the step (2) by electroplating, or selectively covering the copper film obtained from the step (2) and thickening an uncovered copper film by electroplating. The specific thickness is decided as per the products.

Preferably, when the modification treatment is conducted on the surface of the material to be etched, by the first plasma and the second plasma, an atmospheric pressure range of the discharging via capacitive coupling in the vacuum is 30-80 Pa.

Preferably, the aliphatic amine includes methylamine, primary amine, or secondary amine; wherein the number of carbon atoms of the aliphatic amine is less than 7; and a treating time of the first plasma is 5-20s.

Preferably, a ratio of cupric sulfate to water in the cupric sulfate solution is more than 1:2; and a treating time of the second plasma is 10-30s.

Preferably, the surface of the material to be etched is made of polyimide material or epoxy resin material. The polyimide material may be a polyimide film or polyimide cover plate. The epoxy resin material may be an epoxy resin board coated with fiberglass cloth When the material to be treated is the epoxy resin board coated with fiberglass cloth or polyimide (PI) film, after the surface of the material is treated, electroless copper deposition and electroplating for thickening the copper film are conducted on the surface. Thus, a rigid printed circuit board laminate and a flexible printed circuit board laminate, having an ultra-thin metal layer are obtained respectively. The laminate can be used to prepare a single-sided printed circuit board, a double-sided printed circuit board, a multi-layer printed circuit board, a rigid-flex printed circuit board, and a multi-layer high-density interconnection printed circuit board, and can be applied in the processes of blind vias, buried vias, and via filling.

One typical embodiment of the present invention includes the following process steps:

Providing a dielectric material of the printed circuit board, i.e., the epoxy resin board coated with fiberglass cloth or polyimide (PI) film into a chamber of vacuum capacitive coupling discharge plasma generator. The alkaline gaseous aliphatic amine containing amino chemical groups and the nitrogen bubbled in the cupric sulfate solution are discharged via capacitive coupling in a vacuum to generate plasma. The surface of the dielectric layer is physically and chemically etched, and grafted with active groups such as amino, hydroxyl, sulfonic acid radical etc. on the surface at the same time for modification treatment.

The electroless copper deposition or sputtering copper plating is conducted for the treated dielectric material.

Electroplating is conducted to thicken the copper film to a required thickness. The preparation of the printed circuit board laminate having an ultra-thin metal layer is completed.

The printed circuit board laminate having an ultra-thin metal layer is used to prepare the substrate of the printed circuit board. The substrate coated with the is treated in step (1) and step (2), to prepare the multi-layer printed circuit board and the rigid-flex printed circuit board by build-up process. The step (1) and (2) are used to perform the processes of blind vias, buried vias, via filling and selective plating.

The method provided by present invention is not only suitable for the preparation of the flexible printed circuit board (also called flexible board) laminate, having a polyimide film as a dielectric layer, but also suitable for the preparation of the rigid printed circuit board (also called rigid board) laminate, having epoxy resin as a dielectric layer. Furthermore, the technique can also be used in the build-up preparation process of the multi-layer printed circuit board to prepare a multi-layer printed circuit board and a rigid-flex printed circuit board. Hence, a process of covering copper foil is not required. The present invention can freely control the thickness of electrolytic plated copper layer. The present invention can realize the preparation of the printed circuit board having an ultra-thin metal layer, and especially advantageous in the application of high-density circuits. Additionally, copper foils and ink are saved, so that the present invention can effectively reduce the costs and promote the competitiveness of the products.

DETAILED DESCRIPTION OF THE INVENTION

The embodiments of the present invention are shown as below, and they are only used for explaining the present invention, rather than limiting the present invention.

Figure 1:
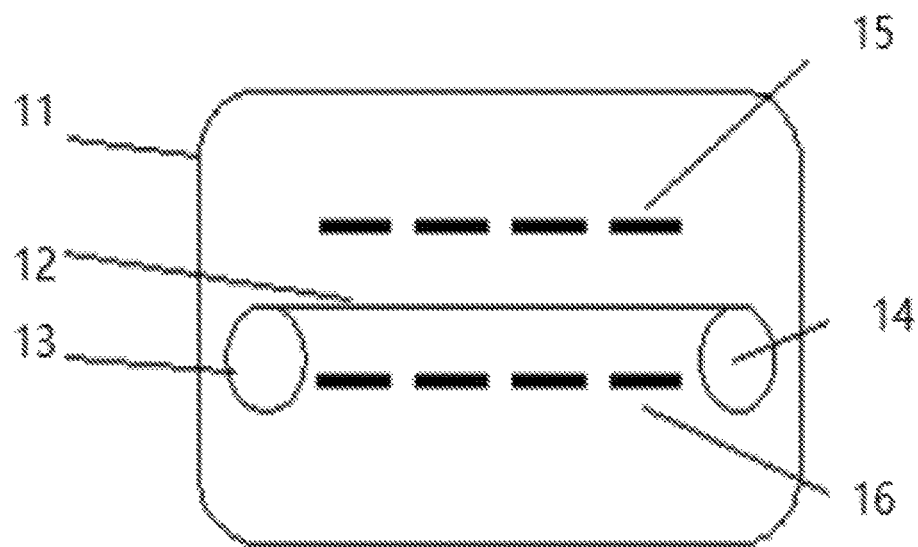
FIG. 1 is a technical solution diagram of the PI film treatment in the present invention; wherein, 11 plasma chamber; 12 polyimide film; 13 unwinding; 14 winding; 15 positive electrode; 16 negative electrode.

Referring to FIG. 1, the present invention uses the method as below to manufacture a single-sided or double-sided printed circuit board laminate having a PI substrate:

(1) Providing a polyimide (PI) film roll on the winding device in a chamber of a low vacuum plasma generator. Vacuumizing the chamber to a vacuum level less than 20 Pa, and then feeding aliphatic amine gas (e.g., methylamine, ethylamine, primary amine, secondary amine etc.), to discharge and generate plasma to etch and graft the polyimide (PI) film. The winding device speed is controlled to ensure that the treatment time for the polyimide (PI) film passing through the plasma discharge region is 5-20s. The roughness of the surface of the polyimide (PI) film is increased by means of the plasma etching effect. At the same time, amino NH2 is grafted on the surface of the polyimide (PI) film.

(2) Stopping supply of the aliphatic amine gas and pumping till the vacuum level is below 20 Pa, feeding the nitrogen bubbled by the cupric sulfate solution (Cupric sulfate: Deionized water ≥1:2) to conduct a plasma discharge treatment for 10-30s. Stopping the device and feeding the air, taking out the polyimide (PI) film.

(3) Forming a copper film on the surface of the substrate by electroless copper plating or sputtering copper plating to meet the electroplating condition.

(4) Thickening the copper film by electroplating to complete the manufacturing of a single-sided or double-sided laminate of the flexible printed circuit board.

(5) Preparing the printed circuit board.

Figure 2:
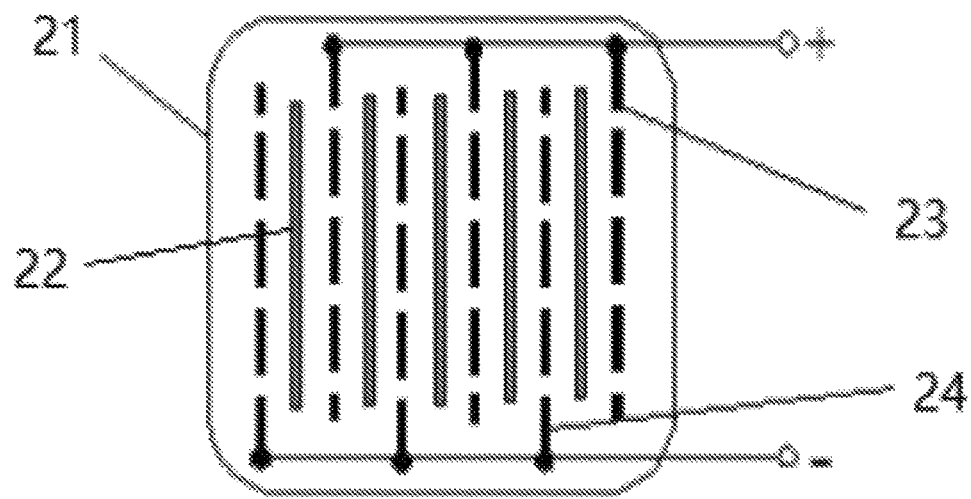
FIG. 2 is a technical solution diagram of treating a plurality of PP films at the same time in the present invention; wherein, 21 plasma chamber; 22 PP films; 23 positive electrode; 24 negative electrode.

Referring to FIG. 2, the present invention uses the method as below to prepare a single-sided or double-sided printed circuit board laminate having a PP substrate:

The epoxy resin (PP) board coated with fiberglass cloth is suspended and provided between a positive electrode and a negative electrode of the low vacuum plasma generator. The single-sided or double-sided printed circuit board laminate having a PP substrate is prepared according to above steps of the first solution.

Embodiment 1

Figure 3:
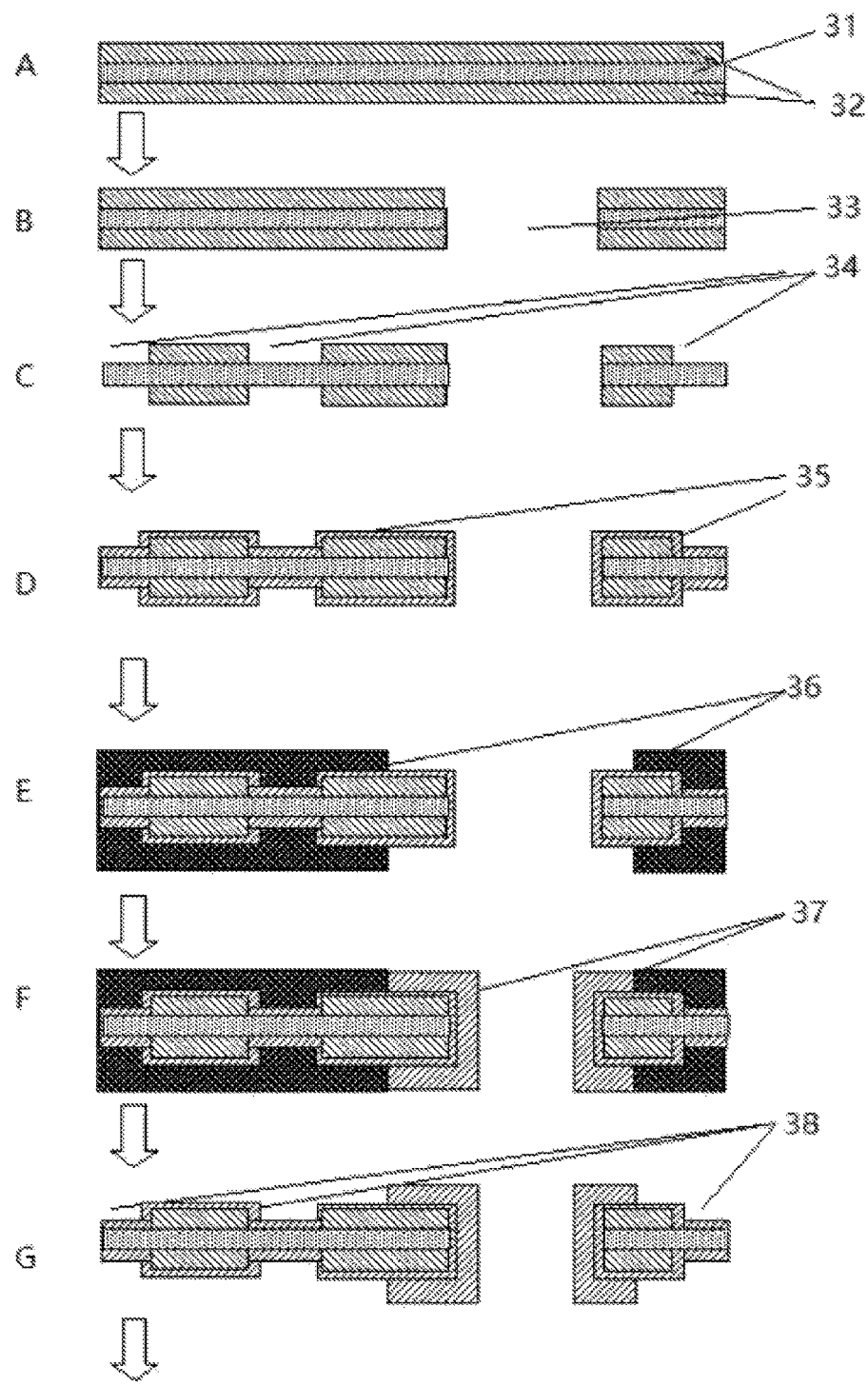
FIG. 3 is a diagram of a new selective plating process of two-layer flexible board; wherein, 31 polyimide (PI) film; 32 copper film; 33 drilling hole; 34 exposure, development, circuit etching; 35 electroless copper plating; 36 press film; 37 drilling hole and plating copper; 38; removing the film, and then micro-etching/electroless copper plating.

Referring to FIG. 3, this embodiment mainly related to a selective plating method of two-layer flexible board, including:

A. preparing a two-layer flexible board laminate including a polyimide (PI) film and a double-sided electroplated copper film;

B. drilling a through via mechanically or by a laser;

C. exposing, developing, and circuit etching;

D. after intensively removing the adhesive by plasma, and etching to increase the roughness and the active groups of the PI surface, performing electroless copper deposition;

E. pressing the dry film, exposing and developing;

F. selectively electroplating only at the drilled through via;

G. micro-etching/chemical copper plating, and proceed to the next procedure.

The objective of selective electroplating is to plate copper at the through via, without plating copper on the flexible board laminate, to make the flexible board region more torsion resistant.

Embodiment 2

Figure 4:
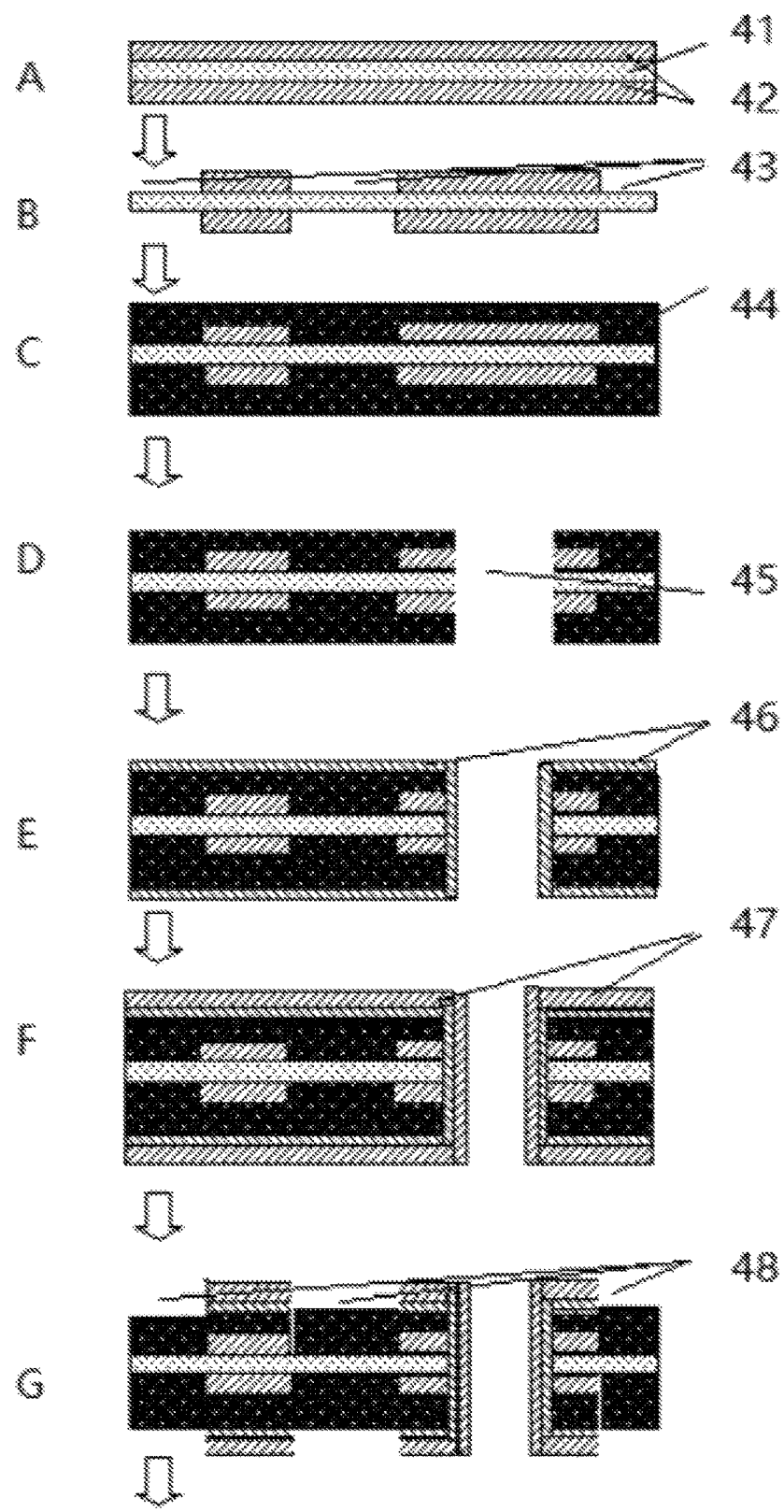
FIG. 4 is a diagram of preparing the four-layer flexible printed circuit board by build-up process; wherein, 41 PI film; 42 copper film; 43 groove etching; 44 CL; 45 through via; 46 chemically deposited film; 47 electroplated copper film; 48 groove etching.

Referring to FIG. 4, this embodiment mainly relates to a method of manufacturing a four-layer flexible printed circuit board (FPCB) by build-up process.

A. preparing a two-layer flexible board laminate including the polyimide (PI) film and double-sided plated copper film;

B. exposing, developing and etching two-layer circuits;

C. pressing a cover layer, wherein the cover layer is heated and pressed in a vacuum without covering a copper foil;

D. drilling a through via, removing the adhesive residue after drilling, plasma etching to increase the surface roughness and the active groups;

E. chemical copper plating;

F. thickening the copper layer by plating;

G. exposing, developing, and etching the print circuits, to complete the preparation of the four-layer flexible printed circuit board, and then proceeding to the testing procedure.

Embodiment 3

Figure 5:
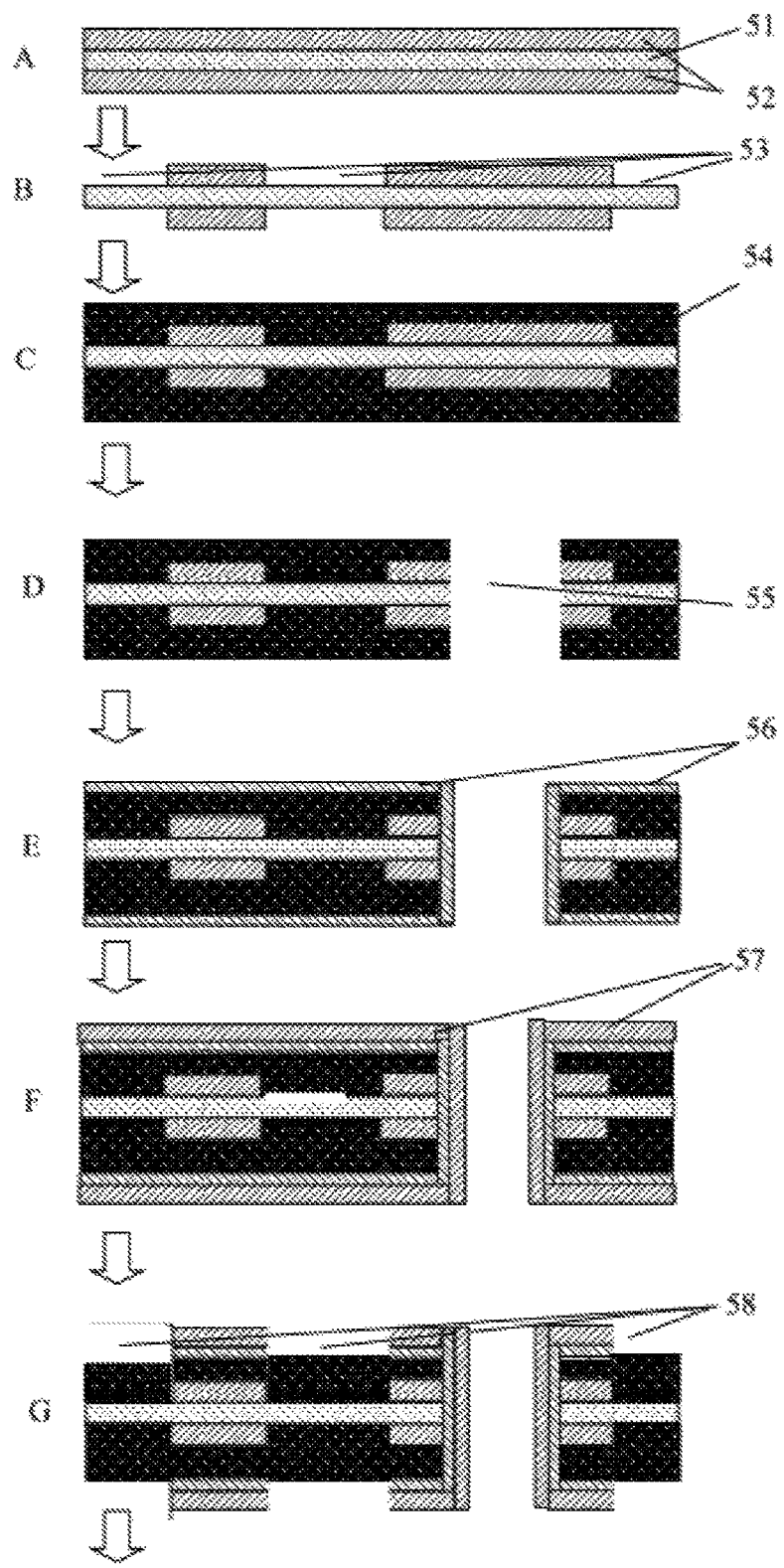
FIG. 5 is a diagram of preparing the four-layer rigid printed circuit board by build-up process; wherein, 51 epoxy resin board coated with fiberglass cloth; 52 double-sided plating copper film; 53 groove etching; 54 PP; 55 through via; 56 chemically deposited copper film; 57 electroplated copper film; 58 groove etching.

Referring to FIG. 5, this embodiment discloses a method of manufacturing a four-layer rigid printed circuit board by build-up process.

A. preparing a two-layer rigid board laminate including a dielectric plate made of the epoxy resin (PP) coated with fiberglass cloth, and a double-sided electroplated copper film;

B. exposing, developing and etching print two-layer circuits;

C. heating and pressing the epoxy resin (PP) coated with fiberglass cloth in a vacuum, without covering a copper foil;

D. drilling a through via, removing the adhesive residue after drilling, plasma etching to increase the surface roughness and the active groups;

E. forming a copper film by electroless copper plating;

F. thickening the copper film obtained from the last step by plating;

G. exposing, developing and etching the print circuits, to complete a preparation of a four-layer rigid printed circuit board, and then proceeding to the testing procedure.

Embodiment 4

Figure 6:
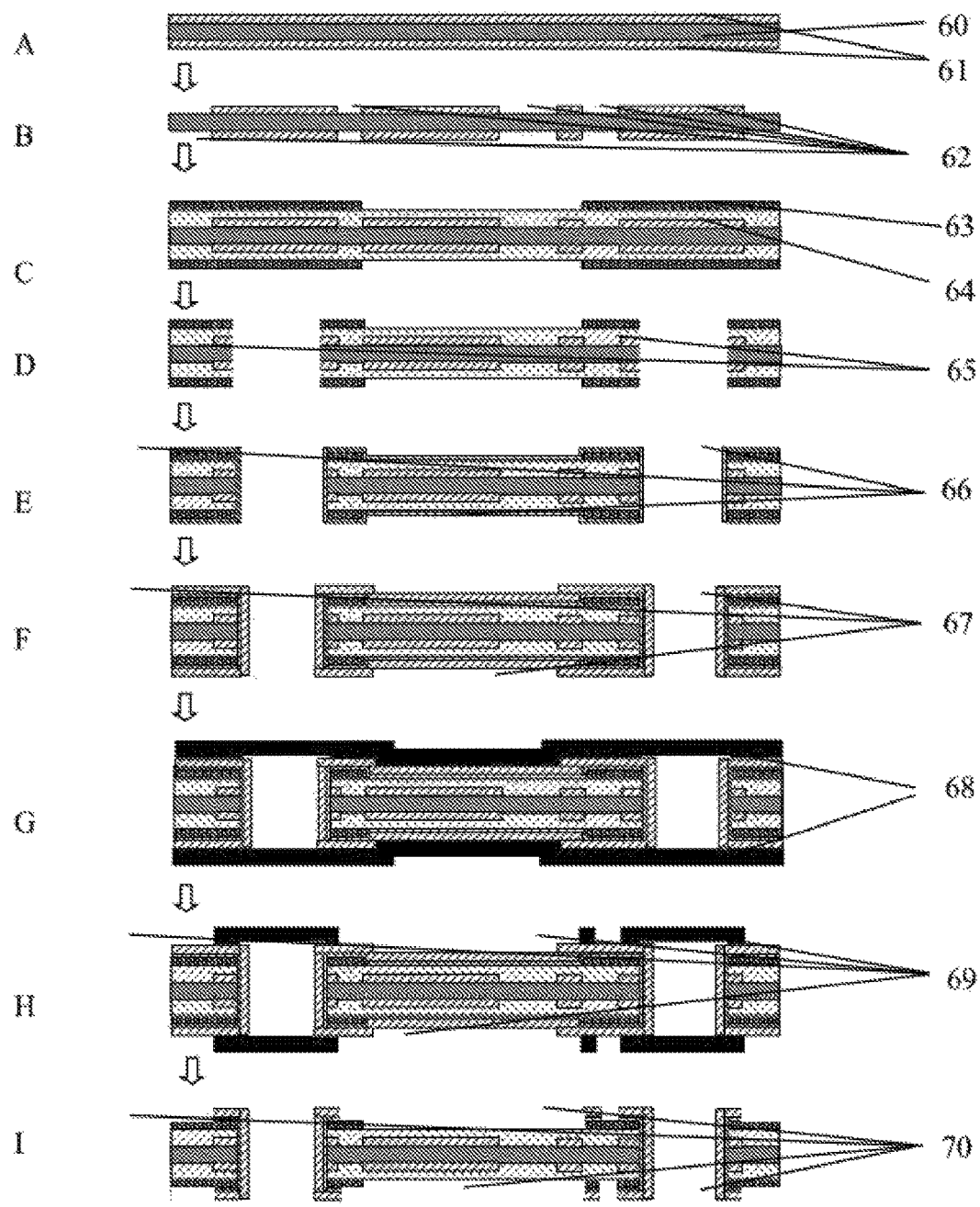
FIG. 6 is a diagram of preparing the rigid-flex printed circuit board by build-up process and new selective plating process; wherein, 60 PI film; 61 electroplated copper film; 62 groove etching; 63 PP; 64 CL; 65 through via; 66 copper deposition on the surface; 67 electroplated copper film; 68 dry film; 69 etched surface; 70 groove etching.

Referring to FIG. 6, this embodiment discloses a method for manufacturing a rigid-flex printed circuit board by build-up process and a new selective plating process.

A. providing a two-layer flexible board laminate (also called a double-sided copper clad laminate-CCL) including a polyimide (PI) film and a double-sided electroplated copper film, wherein the two-layer flexible board laminate is prepared by the first technical solution of the present invention;

B. exposing, developing and etching circuits;

C. directly pressing the cover layer and the epoxy resin (PP-Prepreg) coated with fiberglass cloth in a high temperature and a vacuum, without copper foil;

D. laser or mechanical drilling a through via;

E. after intensively removing the adhesive by plasma, increasing the roughness and the grafted active groups on the PI surface, performing electroless copper deposition;

F. thickening the copper layer by electroplating;

G. pressing the dry film;

H. exposing, developing, and exposing the etched surface;

I. etching, and removing the film to complete the preparation of the rigid-flex printed circuit board and then proceeding to the testing procedure.

Embodiment 5

Figure 7:
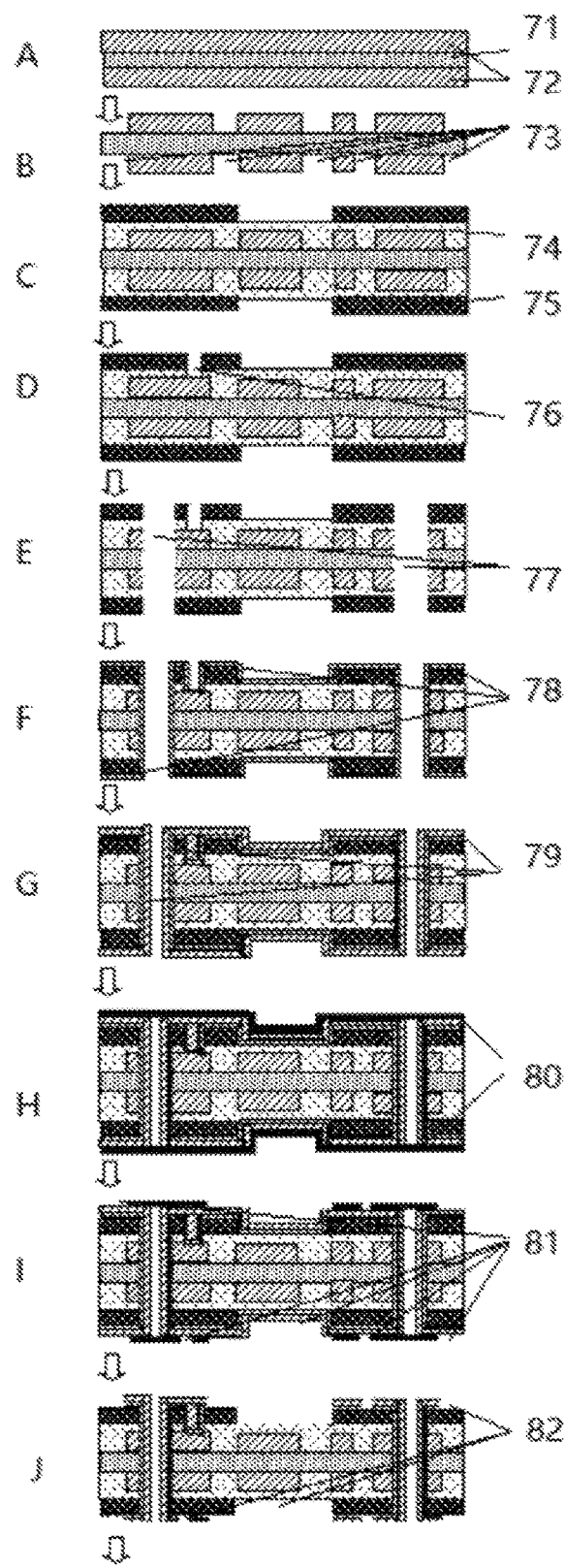
FIG. 7 is a technical solution diagram of the preparation of the rigid-flex high density interconnection board and new selective plating process; wherein, 71 polyimide film (PI); 72 double-sided plated copper film; 73 groove etching; 74 CL; 75 PP; 76 blind via; 77 through via; 78 copper deposition on the surface; 79 electroplated copper film; 80 dry film; 81 etched surface; 82 groove etching.

Referring to FIG. 7, this embodiment mainly relates to a method for manufacturing a rigid-flex high-density interconnection board and a new selective plating process.

A. providing a two-layer flexible board laminate including a polyimide (PI) film and a double-sided electroplated copper film, wherein the two-layer flexible board laminate is prepared by the first technical solution of the present invention;

B. exposing, developing and etching circuits;

C. pressing the cover layer and the epoxy resin (PP) in a high temperature, a high pressure and a vacuum, without a copper foil;

D. drilling a blind via by laser;

E. mechanical drilling a through via;

F. after intensively removing the adhesive by plasma, increasing the roughness and the grafted active groups on the PI surface, performing electroless copper deposition;

G. filling the blind via 86 and thickening the copper layer by electroplating;

H. attaching dry film;

I. exposing, developing, and exposing the etching surface

J. etching, and removing the film to complete the preparation of the rigid-flex high-density interconnection board and then proceeding to the testing procedure.

The adhesive free flexible printed circuit board (FPCB) laminate having an ultra-thin polyimide (PI) and the adhesive free rigid printed circuit board laminate having an ultra-thin metal layer can be produced by the method of the present invention. Further, the method of the present invention can also be used for manufacturing multi-layer printed circuit board, blind via, and buried via by build-up process, and the selective plating process. The obtained built-up electroplated copper layer is thin, and can be used to produce the thinner circuits.

The above description is just for the preferred embodiments of the present invention, and is not intended to limit the present invention. Any modifications, equivalent replacements, simple improvements etc. within the substantial contents of the present invention, fall in the scope of the present invention.

What is claimed is:

1. A method for manufacturing a printed circuit board having an ultra-thin metal layer, wherein the method comprises steps as below:

(1) providing a material to be etched in a chamber of a vacuum capacitive coupling discharge plasma generator; conducting a modification treatment on a surface of the material to be etched by a first plasma and a second plasma to obtain an etched material; wherein the first plasma is generated by discharging gaseous aliphatic amine via capacitive coupling in a vacuum, and the second plasma is generated by discharging nitrogen bubbled in a cupric sulfate solution via capacitive coupling in the vacuum; the modification treatment includes etching, and grafting active groups including amino, hydroxyl, and/or sulfonic acid radical on the surface of the material to be treated; and (2) fully or partially forming a copper film on the surface of the etched material by an electroless copper deposition or a sputtering copper deposition.

2. The preparation method of a printed circuit board having an ultra-thin metal layer of claim 1, wherein the method further comprises steps as below:

(3) thickening the copper film obtained from the step (2) by electroplating, or selectively covering the copper film obtained from the step (2) and thickening an uncovered copper film by electroplating.

3. The method for manufacturing a printed circuit board having an ultra-thin metal layer of claim 2, wherein a specific process of step (3) includes: pressing a cover layer on the copper film obtained from the step (2), to expose a part of the copper film, and thickening the uncovered copper film by electroplating.

4. The method for manufacturing a printed circuit board having an ultra-thin metal layer of claim 1, wherein when the modification treatment is conducted on the surface of the material to be etched by the first plasma and the second plasma, an atmospheric pressure range of the discharging via capacitive coupling in the vacuum is 30-80 Pa.

5. The method for manufacturing a printed circuit board having an ultra-thin metal layer of claim 1, wherein the aliphatic amine includes methylamine, primary amine, or secondary amine; wherein the number of carbon atoms of the aliphatic amine is less than 7; and a treating time of the first plasma is 5-20s.

6. The method for manufacturing a printed circuit board having an ultra-thin metal layer of claim 1, wherein a ratio of cupric sulfate to water in the cupric sulfate solution is more than 1:2; and a treating time of the second plasma is 10-30s.

7. The method for manufacturing a printed circuit board having an ultra-thin metal layer of claim 1, wherein the surface of the material to be etched is made of polyimide material or epoxy resin material.

8. The method for manufacturing a printed circuit board having an ultra-thin metal layer of claim 2, wherein when the modification treatment is conducted on the surface of the material to be etched by the first plasma and the second plasma, an atmospheric pressure range of the discharging via capacitive coupling in the vacuum is 30-80 Pa.

9. The method for manufacturing a printed circuit board having an ultra-thin metal layer of claim 2, wherein the aliphatic amine includes methylamine, primary amine, or secondary amine; wherein the number of carbon atoms of the aliphatic amine is less than 7; and a treating time of the first plasma is 5-20s.

10. The method for manufacturing a printed circuit board having an ultra-thin metal layer of claim 2, wherein a ratio of cupric sulfate to water in the cupric sulfate solution is more than 1:2; and a treating time of the second plasma is 10-30s.

11. The method for manufacturing a printed circuit board having an ultra-thin metal layer of claim 2, wherein the surface of the material to be etched is made of polyimide material or epoxy resin material.

* * * * *